United States Patent [19]
DeWalch

[11] Patent Number: 5,542,722
[45] Date of Patent: Aug. 6, 1996

[54] TAMPER RESISTANT METER LOCKING RING

[76] Inventor: Norman B. DeWalch, 6850 Wynnwood, Houston, Tex. 77008

[21] Appl. No.: 312,015

[22] Filed: Sep. 23, 1994

Related U.S. Application Data

[63] Continuation-in-part of Ser. No. 53,582, Apr. 27, 1993, abandoned.

[51] Int. Cl.⁶ .................................................. B65D 45/32
[52] U.S. Cl. ........................................ 292/256.6; 292/327
[58] Field of Search ............................ 292/256.6, 307 R, 292/307 A, 307 B, 258, 327; 70/34, 158–173

[56] References Cited

U.S. PATENT DOCUMENTS

| | | | |
|---|---|---|---|
| 4,413,490 | 11/1983 | Nielsen, Jr. | 70/164 |
| 4,828,300 | 5/1989 | Agbay | 292/256.6 |
| 5,001,912 | 3/1991 | DeWalch | 292/256.6 X |
| 5,410,896 | 5/1995 | Gleason | 70/165 X |

Primary Examiner—Philip C. Kannan
Attorney, Agent, or Firm—Paul L. DeVerter, II

[57] ABSTRACT

A locking ring includes an annular split ring portion with a U-shaped cross section and resiliently separable end portions, with each end formed into an L-shaped wall portion terminating in a serration. When the ends of the locking ring are brought together, the serrations intermesh, and the wall portions form a rectangular enclosure. Substantially solid front and rear housings portions, each containing a hole for receiving a barrel lock and an external groove, fit into the enclosure. The rear housing portion is attached to one wall portion, with its external groove fitting over the rear lip of the U-shaped cross section of the enclosure. The front housing portion is attached to the other wall portion, with its groove fitting over the front lip. When the locking ring is closed, the front housing portion slides over the rear housing portion until the lock receiving holes align. The locking ring also includes a replaceable seal retainer.

11 Claims, 6 Drawing Sheets

TAMPER RESISTANT METER LOCKING RING

This application is a continuation in part of application Ser. No. 08/053,582, which was filed Apr. 27, 1993, now abandoned.

BACKGROUND

1. Field of the Invention

The present invention relates in general to locking rings for securing electricity meters, and more specifically to a single piece locking ring with improved manufacturability and resistance to tampering.

2. Related Inventions

PROBLEMS ADDRESSED BY THE INVENTION

In the electric utility industry, meter locking rings and barrel locks are utilized to deter vandals and to prevent potential power thieves from stealing electricity by altering electricity meter readings or bypassing the meters entirely. Locking rings are used to secure the electricity meters to the meter bases. The rings usually comprise an annular split ring with a generally U-shaped cross section, and a lock receiving assembly which prevents separation of the ends of the split ring when secured with a barrel type lock, such as the one shown in U.S. Pat. No. 4,742,703 (1988, DeWalch et al.). Many utility companies must cost effectively secure a large number of meters, and at the same time combat an increasing power theft rate. Thus there is a need for an inexpensive locking ring which is easy to use and also provides a high level of security.

DISCUSSION OF PRIOR ART

In order to provide background information so that the invention may be completely understood in its proper context, reference is made to the following articles of prior art. In many locking rings, such as the ones shown in U.S. Pat. No. 4,413,490 (1983, Nielsen, Jr.), U.S. Pat. No. 4,008,585 (1977, Lundberg), U.S. Pat. No. 4,674,304 (1987, Guiler), U.S. Pat. No. 3,867,822 (1975, Morse et al.), and U.S. Pat. No. 4,329,860 (1982, Moberg), the ends of the annular split ring portion are held together by a screw. A barrel lock is then used to secure a separate protective housing which covers the ends of the split ring and prevents access to the screw. The relatively complex design of these rings makes them expensive to manufacture. Furthermore, field personnel must keep track of several small, loose parts during installation and removal of the rings, making the rings both time consuming and expensive to use.

In an attempt to solve these problems, simplified locking rings have been developed in which the split ring has a male portion at one end which is inserted into and is generally surrounded by a female portion at the other end. A barrel lock is used to directly secure the male and female portions together. Examples of this type of locking ring are shown in U.S. Pat. No. 4,828,300 (1989, Agbay), U.S. Pat. No. 4,446,603 (1984, Guiler), and U.S. Pat. No. 4,415,190 (1983, Finck, Jr. et al.). By definition, the male end of each of these rings is covered by the female end. However, the female end remains uncovered and unprotected, such that any apertures or terminating edges on the female end of the ring are vulnerable to destructive attack by prying or other means. Furthermore, any seams or spaces between the male and female end portions are similarly exposed and vulnerable. Whatever the precise merits, features, and advantages of the above cited references, they do not achieve or fulfill the purposes or objects of the present invention as set forth below.

SUMMARY OF THE INVENTION

OBJECTS OF THE INVENTION

Accordingly, several objects and advantages of my invention are:

(a) To provide a locking ring which is simple in design.

(b) To provide a locking ring having a mutually protective end design, which provides improved resistance to physical destruction by prying or other means.

(c) To provide a locking ring with replaceable means for accepting a security seal.

(d) To provide a locking ring which is inexpensive to manufacture.

Brief Physical Description

The locking ring of the present invention comprises an annular split ring with a U-shaped cross section, which fits over the radially extending, circular flanges of an electricity meter and base, and secures the meter to the base in a manner which is well known. Each end of the split ring is formed into an L-shaped wall portion, with the longer leg of each wall portion extending radially outward. The shorter legs extend towards each other, and each short leg terminates in a serration. When the ends of the locking ring are brought together, the complimentary serrations intermesh, and the L-shaped wall portions form three sides of a generally rectangular enclosure. The U-shaped cross section of the ring material continues throughout the L-shaped protrusions, so that there is an internal lip along both the front and rear perimeters of the rectangular enclosure.

The L-shaped wall portions combine with substantially solid front and rear housing portions to form two end protrusions. Each housing portion contains a hole for receiving the barrel lock and an external groove for receiving a lip of the ring material, and each housing portion has the same general shape as the rectangular enclosure. The rear housing portion is permanently attached to the inside of the left L-shaped wall portion, with the rear internal lip of this wall portion fitting into the groove on the rear housing portion. Similarly, the front housing portion is permanently attached to the inside of the right L-shaped wall portion, with the front internal lip of this wall portion fitting into the groove on the front housing portion. When the locking ring is installed on the meter, the ends of the ring are brought together, and the front housing portion slides over the rear housing portion until the lock receiving holes in the housing portions align to receive the barrel lock. In this configuration, the external groove in the front housing portion receives the front internal lip from the left protrusion, and the external groove in the rear housing portion receives the rear internal lip from the right protrusion.

The front housing portion includes a generally conical lock guard portion. The rear housing portion has an internal ball receiving groove and a raised boss on its front face. The locking ring also includes a flat seal retainer with a through hole which is removably snapped or staked onto the raised boss on the rear housing portion. The seal retainer has a protruding tab with a seal receiving aperture therethrough. When the ring ends are brought together, the tab passes through a slot in the long leg of the right L-shaped wall portion, so that the seal receiving aperture extends beyond the slot.

Present Invention vs. Prior Art

The locking ring of the present invention is easier to manufacture and use than the multiple piece locking rings of the prior art. The locking ring of the present invention is simpler in design and more secure than the male/female single piece rings of the prior art. In the locking ring of the present invention, each end of the ring is equally and mutually protected by the other end. In the prior art rings, the male end is protected by the female end, but the female end remains vulnerable to attack by prying or other means. Finally, the locking ring of the present invention includes a replaceable seal retainer: the prior art locking rings have no such provision.

How the Present Invention Fulfills the Objects

The locking ring of present invention is of a simple, single piece design, and is constructed using a minimal number of components and attachment operations. Through the use of a mutually protective end configuration, potential prying points between components have been substantially eliminated. The seam between the front and rear housing portions is covered by the ends of the split ring material, and the internal lips of the split ring wall portions are protected by the external grooves in the housing portions. The front face of the rear housing portion is protected by the front housing portion, and the rear face of the front housing portion is protected by the rear housing portion. The complementary serrations on the ends of the split ring prohibit the insertion of any substantial prying tool between the ring ends. The locking ring of the present invention is also equipped with a replaceable seal retaining member.

DETAILED DESCRIPTION OF THE PREFERRED EMBODIMENT

Figure 1:
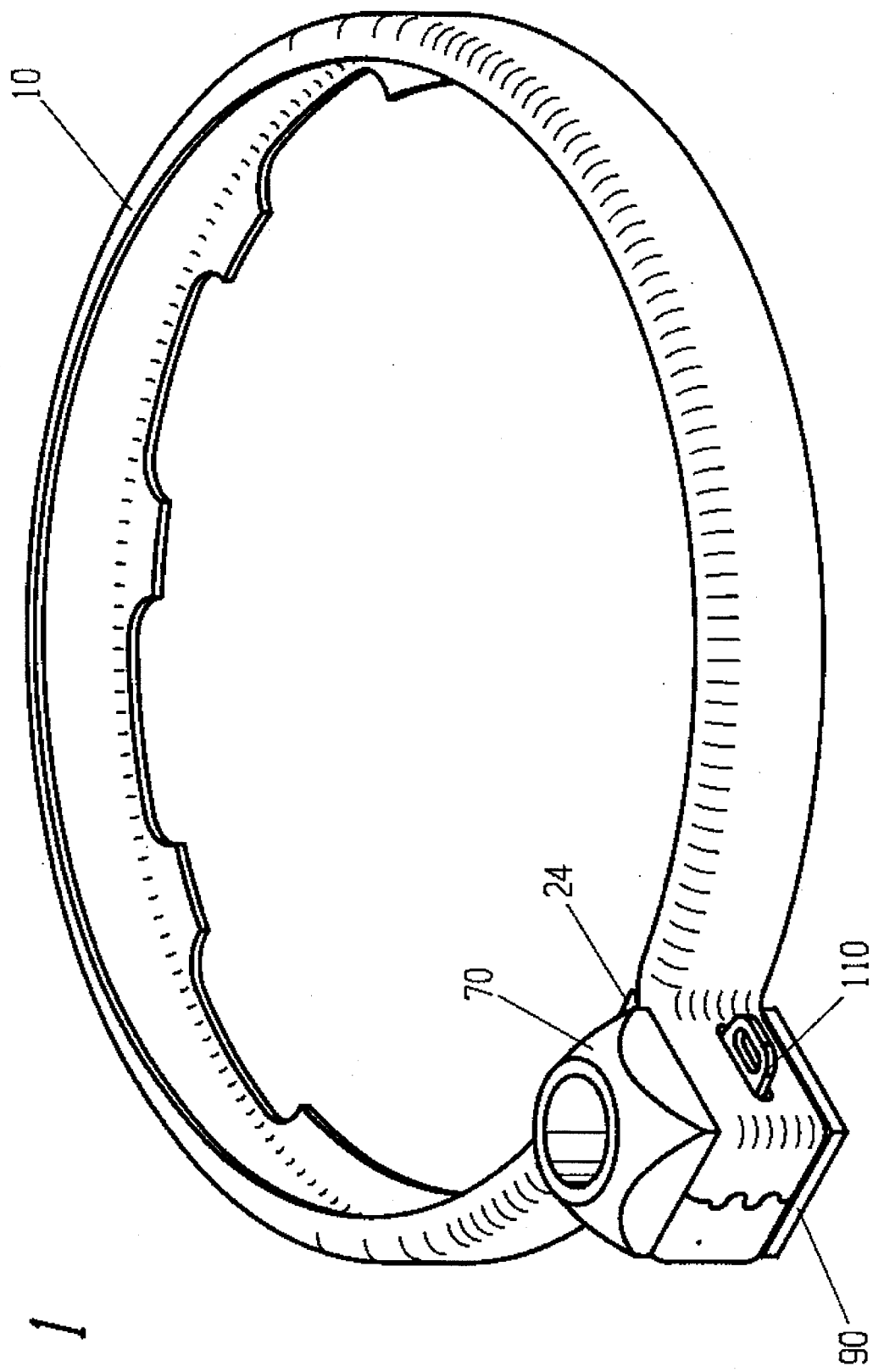
FIG. 1 shows an isometric view of the locking ring in the closed position.
Figure 2:
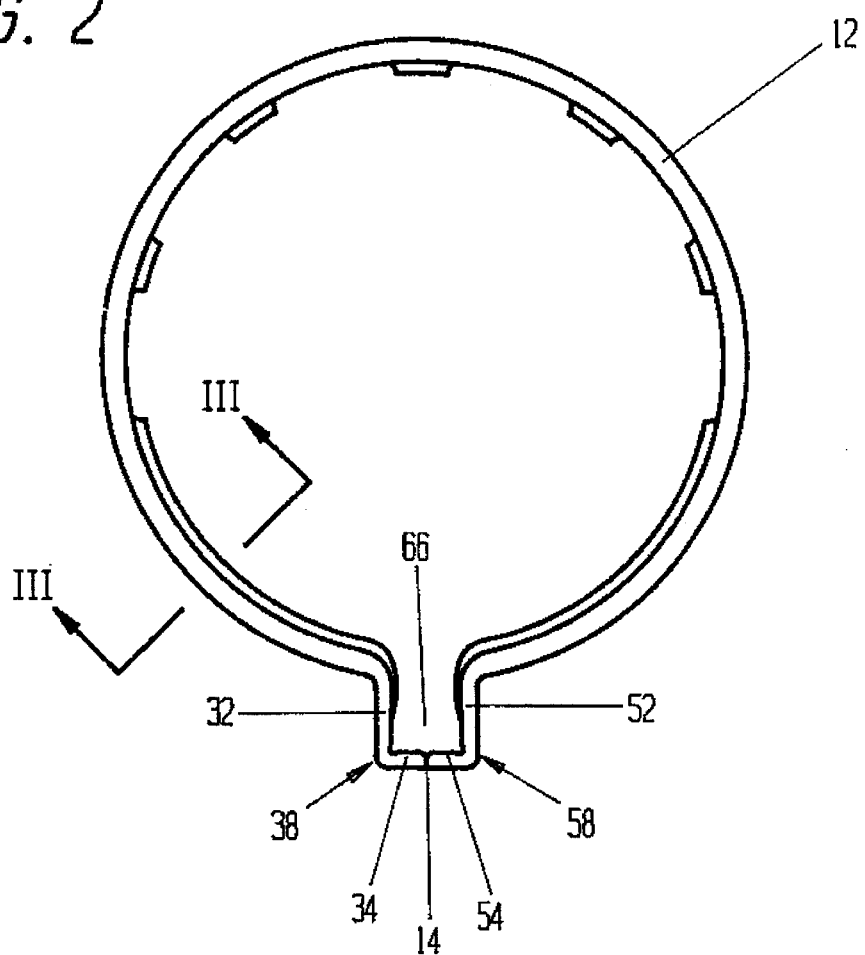
FIG. 2 shows a front view of the split ring.
Figure 4:
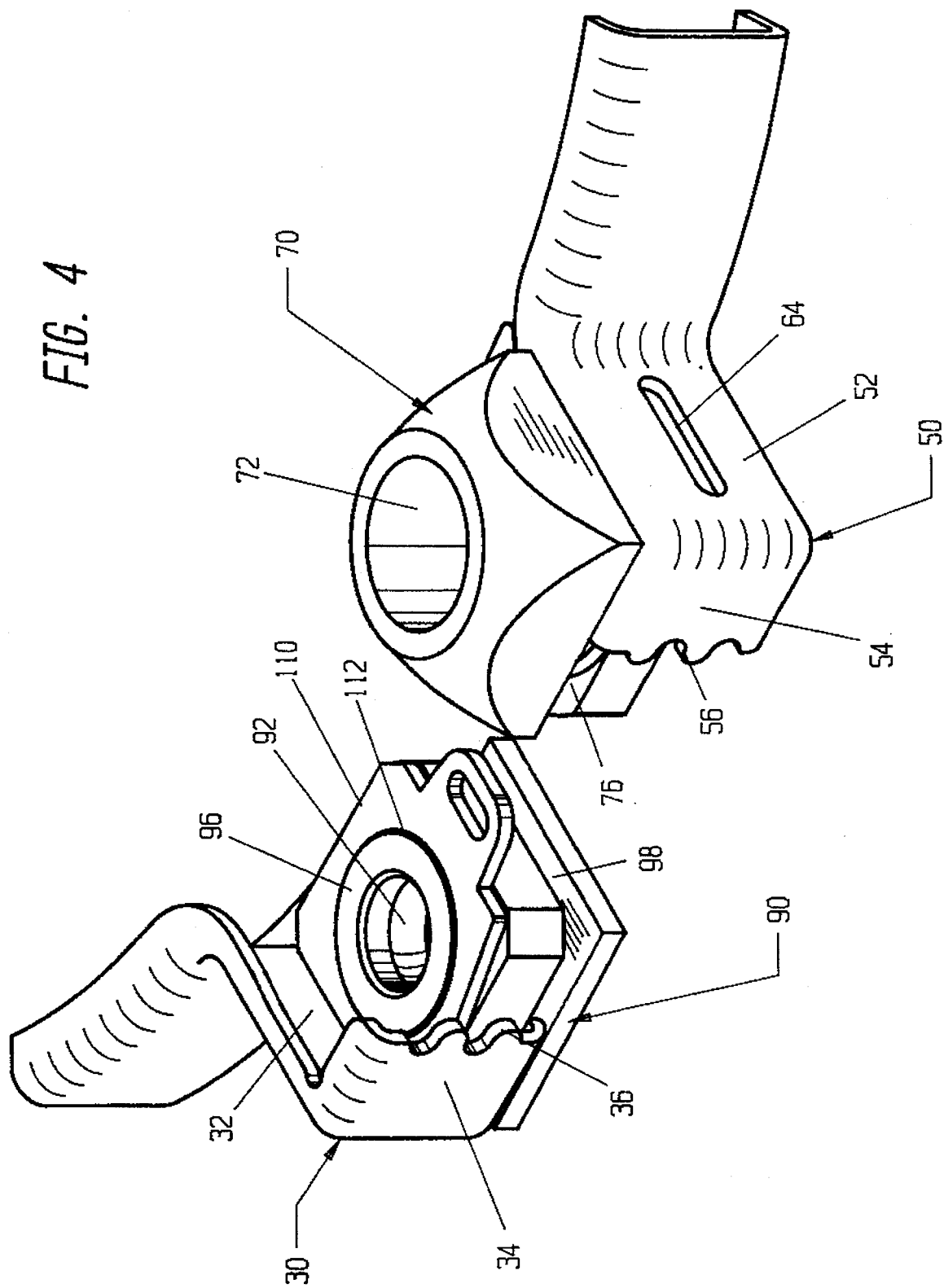
FIG. 4 shows an isometric view of the locking ring ends in the open position.

Referring to FIG. 1, the locking ring of the present invention comprises an annular split ring portion 10, a front housing portion 70, a rear housing portion 90, a gap guard 24, and a replaceable seal retainer 110. The annular split ring portion is shown in FIG. 2, and includes a circular portion 12 with a central axis perpendicular to the plane of the drawing and front and rear sides in the plane of the drawing. The annular split ring portion 12 also includes a radial split 14, and resiliently separable L-shaped wall portions 38 and 58 on the left and right sides of the radial split, respectively. The longer legs 32 and 52 of the wall portions 38 and 58 extend generally radially outward, while the shorter legs 34 and 54 extend tangentially to the annular split ring portion and generally towards each other. The longer legs 32 and 52 of the L-shaped wall portions form the left and right sides of a generally rectangular partial enclosure 66, with the shorter legs 34 and 54 together forming the bottom side of the enclosure. Referring to FIG. 4, the shorter legs 34 and 54 have terminating edges 36 and 56, respectively, with shaped means thereon for impeding the insertion of a straight edged prying tool such as a screw driver between the edges. When the ends of the annular split ring portion are brought together, the complimentary terminating edges 36 and 56 intermesh. In the preferred embodiment, these terminating edges comprise serrations. In general, the serrations comprise a serpentine or sawtooth pattern with no straight sections of substantial length.

Figure 3:
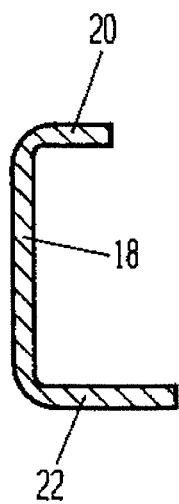
FIG. 3 shows a cross sectional view of the split ring material.
Figure 5:
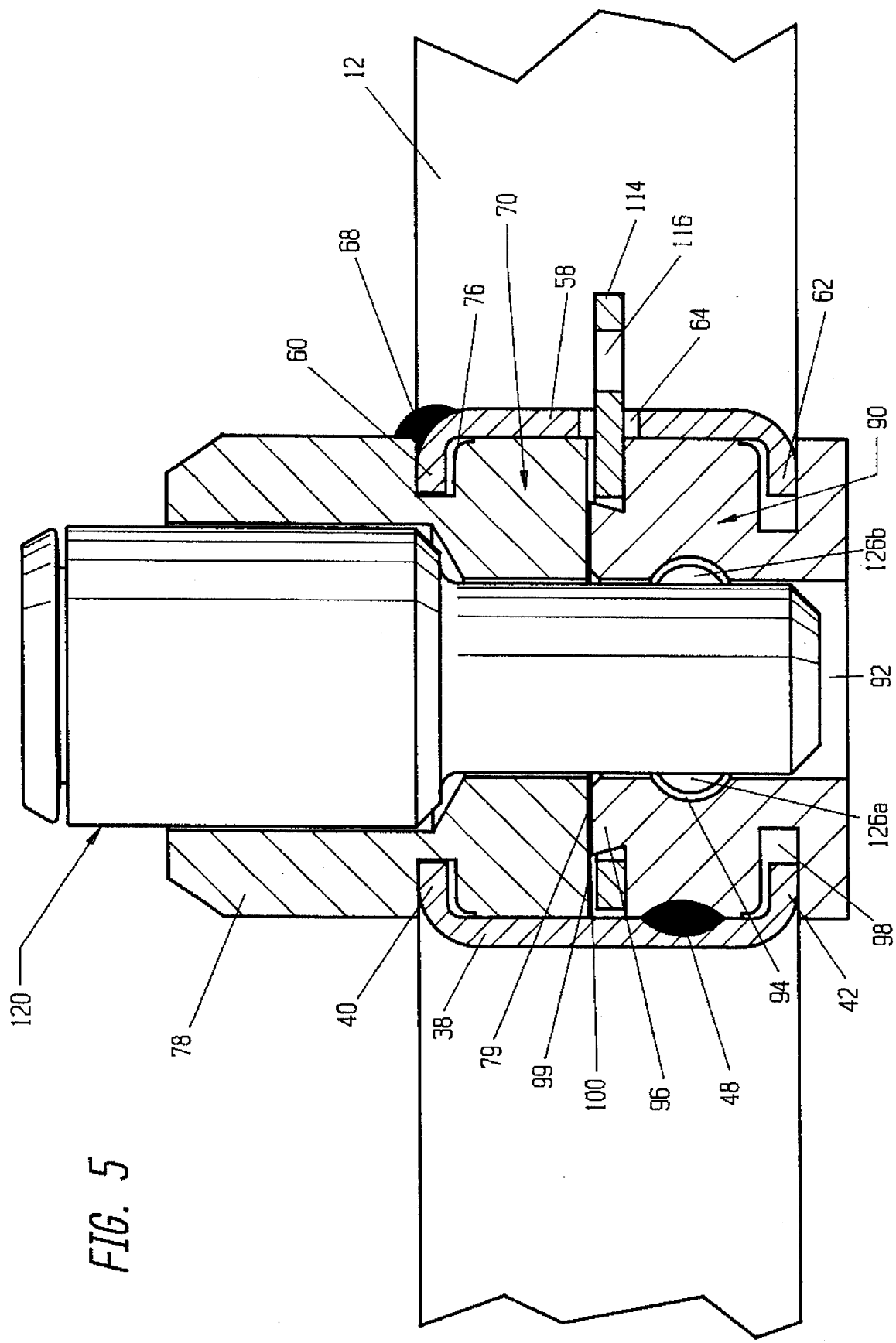
FIG. 5 shows a cross sectional view of the locking ring ends in the closed position with a barrel lock installed.

The annular split ring portion has a U-shaped cross section, shown in FIG. 3, which comprises a sidewall portion 18, a front flange 20, and a rear flange 22. The U-shaped cross section fits over the radially extending, circular flanges of an electricity meter and base, and secures the cover to the base in a manner which is well known. Referring to FIG. 5, in the preferred embodiment the U-shaped cross section of the split ring material continues throughout the L-shaped protrusions, so that the left wall portion 38 has front lip 40 and rear lip 42. Similarly, right wall portion 58 has front lip 60 and rear lip 62. Thus there are internal lips on both the front and rear perimeters of the rectangular enclosure defined by the L-shaped wall portions.

Referring to FIGS. 4 and 5, the front housing portion 70 has a lock guard portion 78, a lock receiving hole 72, an external groove 76, and an inner portion 79 comprising a rear face. The front housing portion combines with the right L-shaped wall portion to form the right end protrusion 50. The rear housing portion 90 has a lock receiving hole 92, a raised boss portion 96, an external groove 98, and an inner portion 99 comprising a front face. The rear housing portion combines with the left L-shaped wall portion to form the left end protrusion 30. Each housing portion has the same general shape as the rectangular enclosure 66, shown in FIG. 2, and the axis of each lock receiving hole is generally parallel to the axis of the annular split ring portion 12. As shown in FIG. 5, the rear housing portion 90 is permanently attached, by welding or other suitable means, to the inside of the left wall portion 38, generally toward the rear side of the annular split ring portion at 48. In this configuration, the rear internal lip 42 fits into the external groove 98 of the rear housing portion. Similarly, the front housing portion 70 is permanently attached to the front bend in the right wall portion 58, generally toward the rear side of the annular split ring portion at 68, with the front internal lip 60 fitting into the external groove 76 of the front housing portion. In other embodiments, each of the left and right end protrusions 30 and 50 could be formed as a single component.

Referring to FIGS. 4 and 5, when the end protrusions 30 and 50 are brought together, the locking ring is said to be in the closed state and cannot be removed from the meter. In this state, the external groove 76 in the front housing portion 70 receives the front internal lip 40 from the left L-shaped protrusion 30, and the external groove 98 in the rear housing portion 90 receives the rear internal lip 62 from the right L-shaped protrusion 50. Thus, each of the internal lips 40, 42, 60, and 62 is shielded from access, such that a prying tool cannot be inserted between any of the internal lips and either of the housing portion. In the closed state, the rear face 79 of the front housing portion 70 is shielded by the rear housing portion 90, and the front face 99 of the rear housing portion 90 is shielded by the front housing portion 70. Also, the seam 100 between the front and rear housing portions is covered by the wall portions 38 and 58, such that a prying tool cannot be inserted between the front and rear housing portions.

Figure 6:
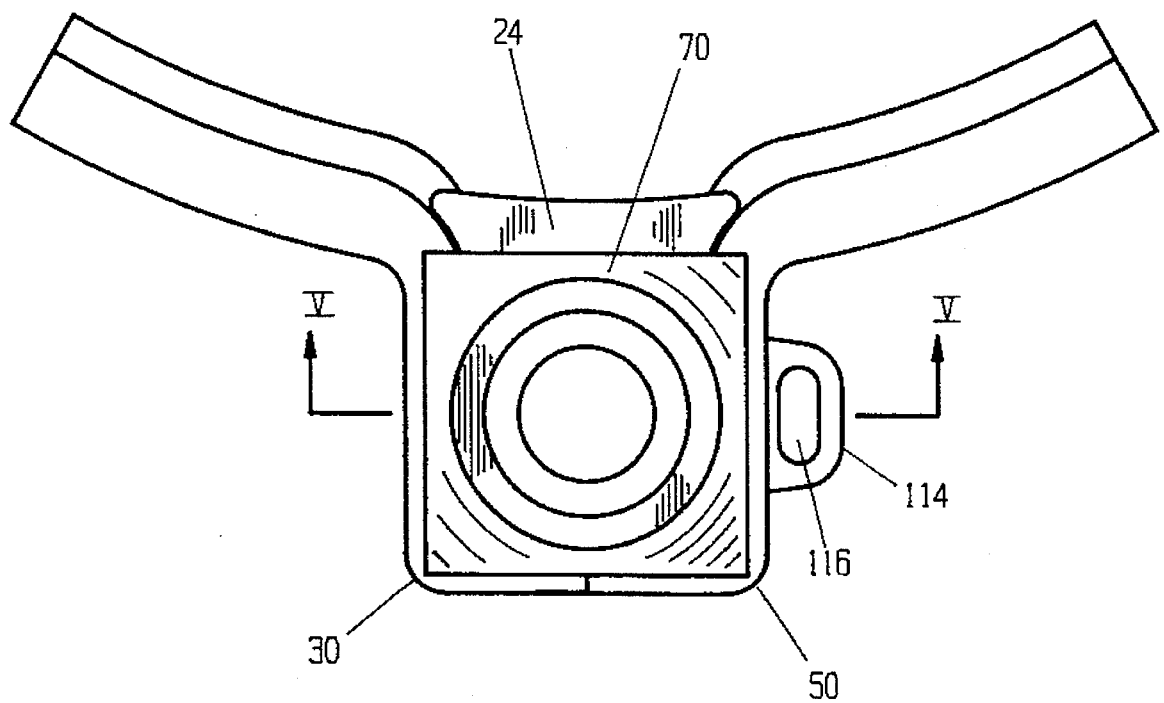
FIG. 6 shows a front view of the locking ring ends in the closed position.

When the locking ring is installed on the meter, the ends of the annular split ring portion are brought together to the closed state, and the front housing portion 70 slides over the rear housing portion 90 until the lock receiving holes 72 and 92 in the housing portions align to receive the barrel lock 120, as shown in FIG. 5. When the lock is installed and locked, the locking balls 126a and 126b extend into the internal ball groove 94 of the rear housing portion, and the locking ring is locked in the closed state. Referring to FIG. 6, the gap guard 24, which is permanently attached to the front housing portion 70, substantially covers any space between the front housing portion and the meter cover, and prevents a prying tool from being inserted into that space in an attempt to remove the locking ring from the meter.

Figure 7:
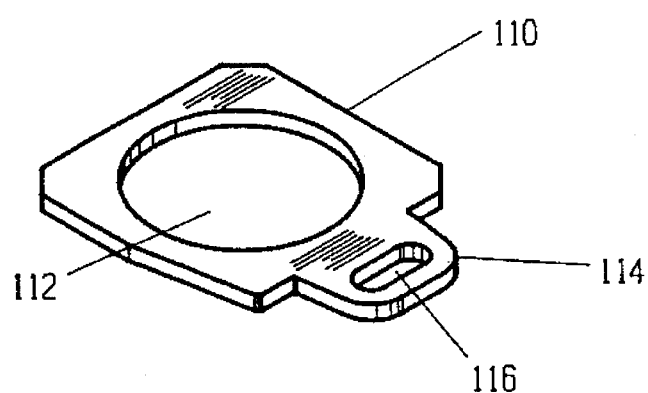
FIG. 7 shows an isometric view of the replaceable seal retainer.

Referring to FIGS. 4 and 7, the replaceable seal retainer 110 has a central through hole 112 which fits over the raised boss 96 on the rear housing portion 90. The seal retainer 110 is removably attached to the boss 96, by staking or other suitable means, such that the seal retainer can later be removed without substantially damaging the boss. The seal retainer also has seal receiving means comprising a protruding member or tab 114 with a seal receiving aperture 116 therethrough. A wire indicator seal of the type commonly used in the electric utility industry can then be passed through the aperture 116. Referring to FIGS. 5, 6 and 7, when the ring is in the closed state, the tab 114 of the seal retainer 110 passes beyond obstructing means on the opposite end protrusion. The obstructing means is designed to physically obstruct and deform the security seal when an attempt is made to open the locking ring, so that any such attempt is visibly indicated. In the preferred embodiment, the obstructing means comprises a slot 64 in the wall portion 58, and the seal receiving aperture 116 extends beyond the slot 64 when the locking ring is closed.

Alternative Embodiments

Figure 8:
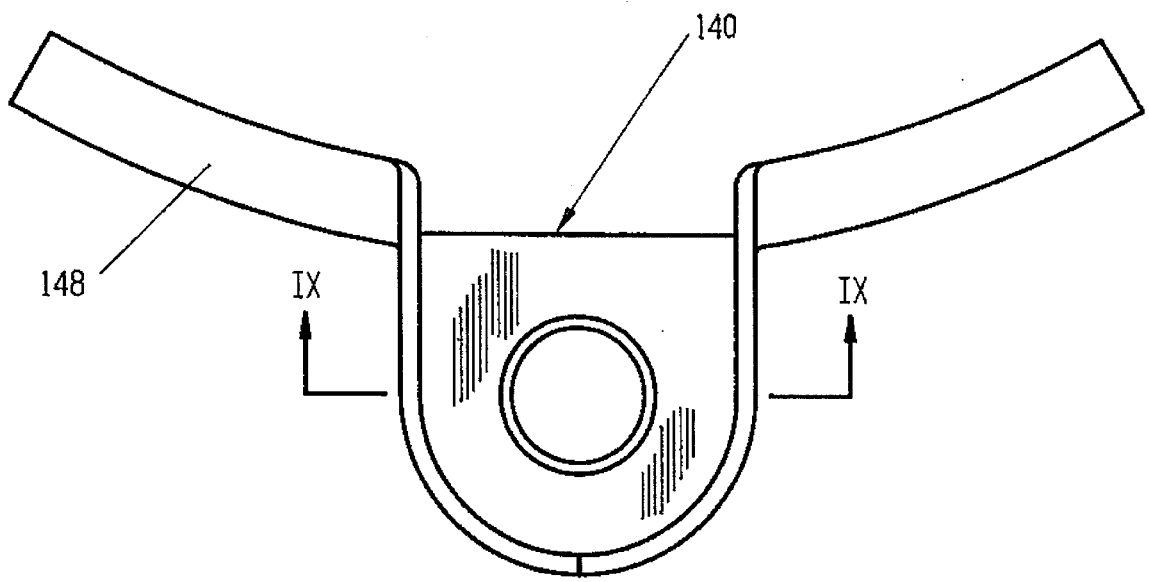
FIG. 8 shows a front view of a reversible alternative embodiment locking ring having simplified; similar D-shaped housings.
Figure 9:
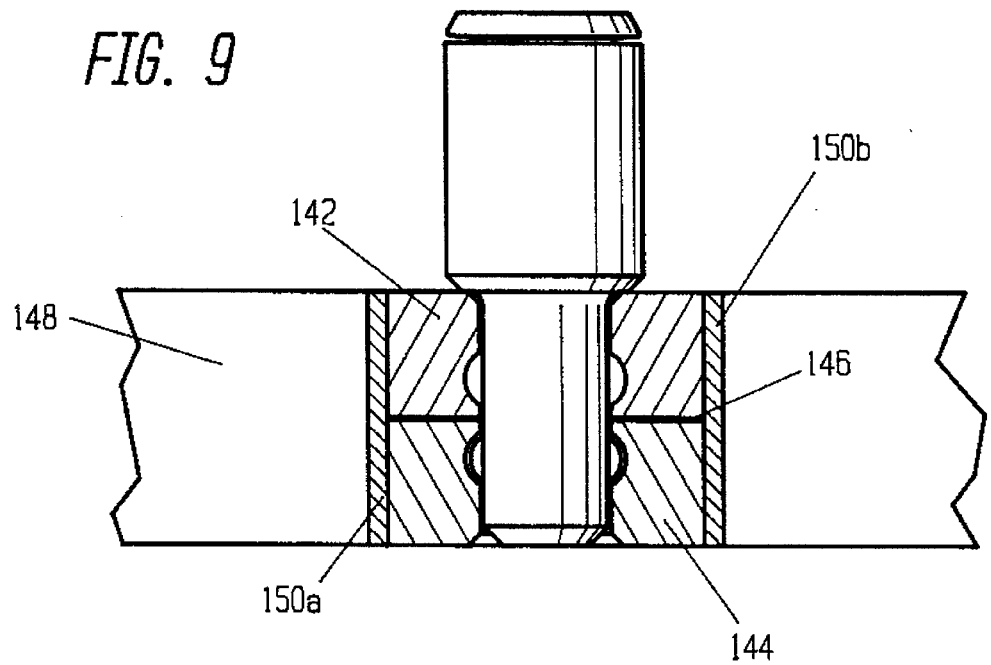
FIG. 9 shows a cross sectional view of the ends of the alternative embodiment locking ring shown in FIG. 8, with a barrel lock installed.

FIGS. 8 and 9 show the end portions of an alternative embodiment locking ring 140 in which the front housing portion 142 and the rear housing portion 144 are substantially the same, such that the front and back of the locking ring 140 can be reversed. The housing portions in this embodiment have a generally D-shaped cross section, although in other embodiments any suitable shape may be used. The seam 146 between the housing portions 142 and 144 is covered by the wall portions 150a and 150b of the annular split ring portion 148, such that a prying tool cannot be inserted between the housing portions.

In other embodiments, the replaceable seal retainer could be any suitable shape and size, and could be made of any suitable material. Also, the central through hole and the seal receiving aperture in the seal retainer could be combined to form a single aperture. Furthermore, the replaceable seal retainer could be used with any locking ring comprising an annular split ring portion with separable ends. The seal retainer could be removably attached by any suitable means to one end of the ring, and the protruding tab and seal receiving aperture would pass through an aperture in the other end of the ring when the ring ends were brought together.

Conclusions, Ramifications, and Scope of the Invention

The present invention is well adapted to carry out the objects and attain the ends and advantages mentioned, as well as others inherent therein. The locking ring of present invention is of a simple, single piece design, and is constructed using a minimal number of components and attachment operations. In the locking ring of the present invention, the generally symmetrical and mutually protective end configuration substantially eliminates potential prying points between components. The seam between the front and rear housing portions is covered by the sidewall of the split ring material, and the internal lips of the split ring protrusions are protected by the external grooves in the housing portions. The intermeshing, complementary serrations on the ends of the split ring prohibit the insertion of a prying tool between the ring ends. While, for the purposes of disclosure there have been shown and described what are considered at present to be the preferred embodiments of the present invention, it will be appreciated by those skilled in the art that other uses may be resorted to and changes may be made to the the details of construction, combination of shapes, size or arrangement of the parts, or other characteristics without departing from the spirit and scope of the invention. It is therefore desired that the invention not be limited to these embodiments and it is intended that the appended claims cover all such modifications as fall within the true spirit and scope of the invention.

What is claimed is:

1. A locking ring for detachably interconnecting two axially aligned, radially extending circular flanges including an annular portion having a radial split, and two end protrusions extending generally radially outward from said annular portion on either side of said radial split, wherein:

(a) said annular portion has a central axis, a front side defined by the furthest extent of said annular portion along said axis in one direction, and a rear side defined by the furthest extent of said annular portion generally along said axis in the opposite direction;

(b) the first of said end protrusions includes a front housing portion located generally at said front side of said annular portion, said front housing portion having an inner portion located on the surface of said front housing portion closest to said rear side of said annular portion;

(c) the second of said end protrusions includes a rear housing portion located generally at said rear side of said annular portion, said rear housing portion having an inner portion located on the surface of said rear housing closest to said front side of said annular portion;

(d) said end protrusions are movable together;

(e) said front housing portion and said rear housing portion overlap each other when said end protrusions are moved together, such that:

(i) said rear housing portion at least partially shields said inner portion of said front housing portion;

(ii) said front housing portion at least partially shields said inner portion of said rear housing portion; and (f) said end protrusions are lockable by locking means when moved together.

2. The locking ring of claim 1, wherein:

(a) said first end protrusion further includes a first wall portion extending rearwardly from said front housing portion;

(b) said second end protrusion further includes a second wall portion extending forwardly from said rear housing portion;

(c) said front housing portion and said rear housing portion form a seam between said inner portions when said end protrusions are moved together; and (d) said wall portions of said end protrusions at least partially cover said seam when said end protrusions are moved together, whereby insertion of a prying tool into said seam is impeded.

3. The locking ring of claim 2, wherein each of said front and rear housing portions has an external groove, and each of said first and second wall portions further include an internal lip portion disposed generally at a right angle thereto, such that when said end protrusions are moved together:

(a) said internal lip portion of said first wall portion fits into said external groove of said rear housing portion, whereby insertion of a prying tool between said first wall portion and said rear housing portion is impeded; and (b) said internal lip portion of said second wall portion fits into said external groove of said front housing portion, whereby insertion of a prying tool between said second wall portion and said front housing portion is impeded.

4. The locking ring of claim 3, wherein:

(a) each of said first and second wall portions is generally L-shaped and includes a radial leg extending generally radially outward from said annular portion, and a tangential leg extending generally tangentially to said annular portion and towards the opposite said end protrusion;

(b) each of said front and rear housing portions is generally rectangular; and (c) said wall portions include terminating edges which intermesh when said end protrusions are moved together, whereby insertion of a prying tool between said terminating edges is impeded.

5. The locking ring of claim 4, wherein said terminating edges are serrations.

6. The locking ring of claim 5, further including:

(a) a replaceable seal retainer removably attached to one of said end protrusions, said seal retainer including a protruding portion with a seal receiving aperture therethrough for receiving a security seal; and (b) obstructing means on the other said end protrusion which deforms or destroys said security seal when: said security seal is installed in said seal receiving aperture and said end protrusions are subsequently separated.

7. The locking ring of claim 6, wherein:

(a) said protruding portion of said seal retainer is a tab; and (b) said other of said end protrusions includes a tab receiving aperture sized such that said tab and said security seal cannot pass through said tab receiving aperture simultaneously.

8. A locking ring for detachably interconnecting two axially aligned, radially extending circular flanges, said locking ring including an annular portion having a radial split, and two end protrusions extending generally radially outward from said annular portion on either side of said radial split, wherein:

(a) said end protrusions are movable together;

(b) said end protrusions are lockable together by locking means; and (c) said end protrusions include terminating edges which intermesh when said end protrusions are moved together, whereby insertion of a prying tool between said terminating edges is impeded when said locking ring is locked.

9. The locking ring of claim 8, wherein said terminating edges are serrations.

10. In a locking ring including an annular portion having a radial split and separable ends on either side of said radial split, said separable ends being movable together, the improvement comprising:

(a) a replaceable seal retainer removably attached to one of said separable ends, said seal retainer including a protruding portion with a seal receiving aperture therethrough for receiving a security seal; and (b) obstructing means on the other said separable ends which deforms or destroys said security seal when: said security seal is installed in said seal receiving aperture and said separable ends are subsequently separated.

11. The improvement of claim 10, wherein:

(a) said protruding member of said seal retainer is a tab; and (b) said other of said separable ends includes a tab receiving aperture sized such that said tab and said security seal cannot pass through said tab receiving aperture simultaneously.

* * * * *